United States Patent
Singh et al.

(10) Patent No.: US 9,647,145 B1
(45) Date of Patent: May 9, 2017

(54) METHOD, APPARATUS, AND SYSTEM FOR INCREASING JUNCTION ELECTRIC FIELD OF HIGH CURRENT DIODE

(71) Applicant: GLOBALFOUNDRIES INC., Grand Cayman (KY)

(72) Inventors: Jagar Singh, Clifton Park, NY (US); Shesh Mani Pandey, Saratoga Springs, NY (US); Josef Watts, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/012,563

(22) Filed: Feb. 1, 2016

(51) Int. Cl.
*H01L 29/861* (2006.01)
*H01L 29/06* (2006.01)
*H01L 29/66* (2006.01)
*H01L 27/08* (2006.01)

(52) U.S. Cl.
CPC ...... *H01L 29/8613* (2013.01); *H01L 27/0814* (2013.01); *H01L 29/063* (2013.01); *H01L 29/66136* (2013.01)

(58) Field of Classification Search
CPC .................................................. H01L 27/0814
USPC .......................................................... 257/493
See application file for complete search history.

(56) References Cited

U.S. PATENT DOCUMENTS

| | | | |
|---|---|---|---|
| 2009/0087289 A1* | 4/2009 | Osada | H01L 21/67769 414/223.01 |
| 2016/0005738 A1* | 1/2016 | Liu | H01L 27/0924 257/369 |
| 2016/0181358 A1* | 6/2016 | Zhang | H01L 29/66689 257/339 |

* cited by examiner

*Primary Examiner* — Dung Le
(74) *Attorney, Agent, or Firm* — Williams Morgan, P.C.

(57) ABSTRACT

Diodes for use in FinFET technologies having increased junction electric fields without the need for increased dopant concentrations, as well as methods, apparatus, and systems for fabricating such diodes. The diodes may comprise a semiconductor substrate and a plurality of fins formed on the semiconductor substrate; wherein each of the plurality of fins comprises an N channel doped region comprising an N channel dopant, and the semiconductor substrate further comprises a plurality of P channel doped regions comprising a P channel dopant, wherein each of the P channel doped regions is disposed under one of the plurality of fins and is adjacent to the N channel doped region of the fin.

20 Claims, 5 Drawing Sheets

METHOD, APPARATUS, AND SYSTEM FOR INCREASING JUNCTION ELECTRIC FIELD OF HIGH CURRENT DIODE

BACKGROUND OF THE INVENTION

Field of the Invention

Generally, the present disclosure relates to the manufacture and use of sophisticated semiconductor devices, and, more specifically, to various methods, structures, and systems for increasing the junction electric field of high current diodes.

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Integrated circuits comprising diodes are known, wherein the diode is formed of a P channel doped region (i.e., a region comprising a P-type dopant, i.e., a source of holes) adjacent to an N channel doped region (i.e., a region comprising an N-type dopant, i.e., a source of electrons). The region of adjacency between P channel doped region and N channel doped region may be referred to as a "junction" or a "depletion region." As is generally understood by the person of ordinary skill in the art, an electric field across a junction arises from the diffusion of electrons from the N channel doped region to the P channel doped region and the diffusion of holes in the opposite direction. An increase in the junction electric field can directly contribute to higher diode forward junction current, and thus, higher performance of the diode and integrated circuits comprising the diode.

It is known to increase the electric field across the junction by increasing the concentrations of P-type dopants and N-type dopants in the corresponding channel regions of the diode. However, at high junction electric fields, carrier mobility suffers from ionized impurity scattering. Ionized impurity scattering increases with increasing total dopant concentration (up to about $10^{19}$ cm$^{-3}$) due to the screening effect. It should be borne in mind that carrier mobility is proportional to the average time between scattering events, not the minority-carrier recombination lifetime.

Therefore, it would be desirable to increase diode junction electric fields without increasing total dopant concentrations in both N channel doped regions and P channel doped regions to greater than about $10^{19}$ cm$^{-3}$.

The present disclosure may address and/or at least reduce one or more of the problems identified above regarding the prior art and/or provide one or more of the desirable features listed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various diodes for use in FinFET technologies having increased junction electric fields without the need for increased dopant concentrations, as well as methods, apparatus, and systems for fabricating such diodes.

BRIEF DESCRIPTION OF THE DRAWINGS

The disclosure may be understood by reference to the following description taken in conjunction with the accompanying drawings, in which like reference numerals identify like elements, and in which.

Figure 1:
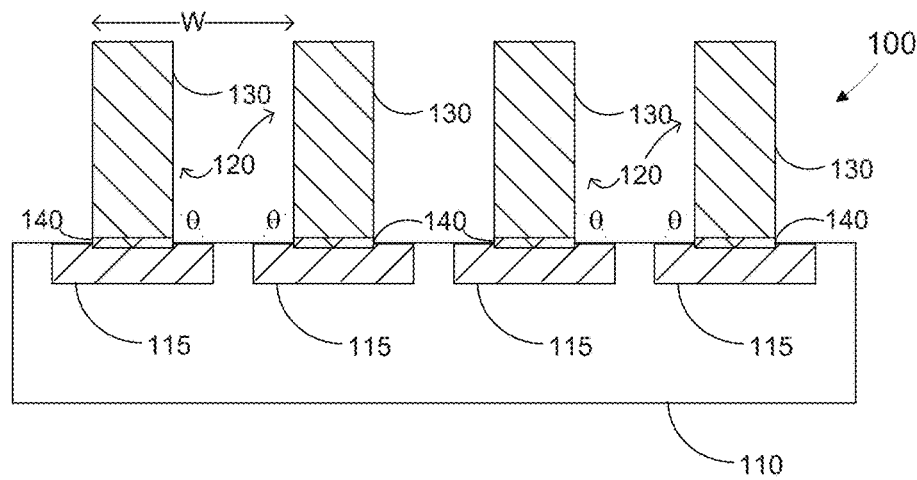
FIG. 1 illustrates a stylized depiction of a first semiconductor device in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for diode structures for integration in FinFET technologies with high electric fields without the need for elevated dopant concentrations.

Turning now to FIG. 1, a first embodiment of a semiconductor device 100 in accordance with embodiments herein is depicted. The semiconductor device 100 comprises a substrate 110 and a plurality of fins 120 formed on the semiconductor substrate 110. The fins 120 may comprise the same material as the semiconductor substrate 110 or may comprise a different semiconducting material. The portion of a fin 120 where the fin meets the semiconductor substrate 110 may be referred to herein as the base of the fin 120. A portion of the fin 120 immediately above the base may be referred to herein as the bottommost portion of the fin 120.

In one embodiment, each fin 120 is substantially vertical, by which is meant a sidewall angle ($\theta$) of the fin is from about 85° to about 90°.

Alternatively or in addition, the plurality of fins 120 may have any desired pitch W, by which is meant the distance from a first edge of the fin to a first edge of the next nearest fin. In one embodiment, the plurality of fins 120 have a pitch from about 22 nm to about 48 nm.

Each of the plurality of fins 120 may comprise an N channel doped region 130 comprising an N channel dopant. Any dopant known to the person of ordinary skill in the art for use in N channel regions of diodes may be used. Each N channel doped region 130 comprises the N channel dopant at an N channel dopant concentration. In one embodiment, the N channel dopant concentration is from about $10^{17}$ atoms/cm$^3$ to about $10^{21}$ atoms/cm$^3$.

Although the embodiment depicted in FIG. 1 shows each of the fins 120 being coextensive with an N channel region 130, in other embodiments (not shown) a fin 120 may be not coextensive with an N channel region 130 (i.e., a fin 120 may comprise regions other than N channel regions). However, in accordance with embodiments herein, each N channel region 130 comprises at least the bottommost portion of each fin 120.

The semiconductor substrate 110 further comprises a plurality of P channel doped regions 115 comprising a P channel dopant at a P channel dopant concentration. Any dopant known to the person of ordinary skill in the art for use in P channel regions of diodes may be used. In one embodiment, the P channel dopant concentration is from about $10^{15}$ atoms/cm$^3$ to about $10^{19}$ atoms/cm$^3$. Each of the P channel doped regions 115 is disposed under one of the plurality of fins 120 and is adjacent to the N channel doped region 130 of the fin.

In one embodiment, each N channel doped region 130 comprises the N channel dopant at an N channel dopant concentration greater than the P channel dopant concentration in each P channel doped region 115.

Appropriate dopants for N channels and P channels are known in the art. The person of ordinary skill in the art having the benefit of the present disclosure may select the particular dopant based on whether the structure has an N+/P layout or an N/P+ layout. For example, in an N/P+ layout, the P+ channel dopant may be boron or boron fluoride and the N channel dopant may be phosphorous, arsenic, or antimony.

As is known to the person of ordinary skill in the art, the interface between an N channel doped region 130 and a P channel doped region 115 of a diode may be known as the junction or depletion region. FIG. 1 labels the various junctions with reference character 140. In one embodiment, the junction 140 between each N channel doped region 130 and the P channel doped region 115 disposed under the fin 120 comprising the N channel doped region 130 is located at the base of the fin 120. The junction 140 may have a width (by which is meant the distance across the narrower of N channel doped region 130 or P channel doped region 115) from about 5 nm to about 14 nm.

Figure 2:
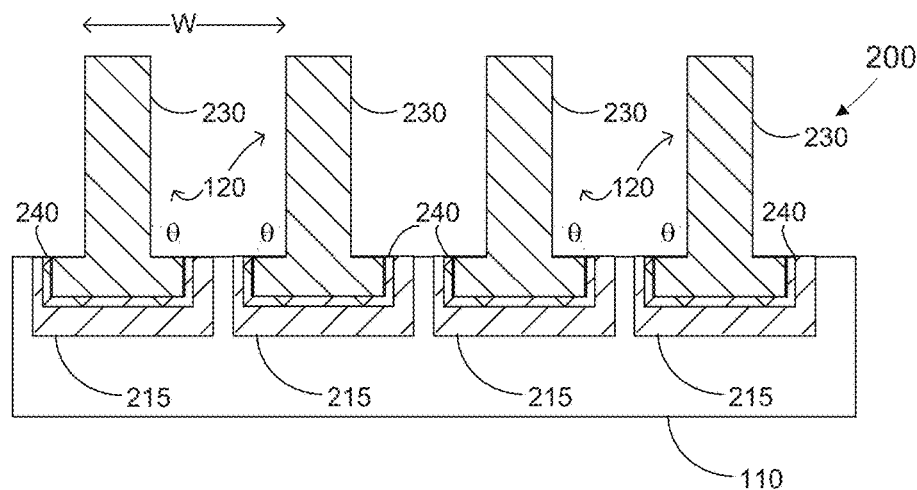
FIG. 2 illustrates a stylized depiction of a second semiconductor device in accordance with embodiments herein.

Turning to FIG. 2, another embodiment of a semiconductor device 200 in accordance with embodiments herein is depicted. Numerous elements shown in FIG. 2 are identical to those described above with reference to FIG. 1 and need not be described again. Elements shown in FIG. 2 that are generally similar to those described above with reference to FIG. 1 have reference characters having a hundreds digit of "2" instead of "1." Such elements can be understood in part by referring to the description of FIG. 1 above, bearing in mind additional description set forth in the following paragraphs.

In the embodiment shown in FIG. 2, in the semiconductor device 200, a junction 240 between each N channel doped region 230 and the P channel doped region 215 disposed under the fin 120 comprising the N channel doped region is located in the substrate below the base of the fin. In this embodiment, the junction may have a width from about 22 nm to about 200 nm.

Figure 3:
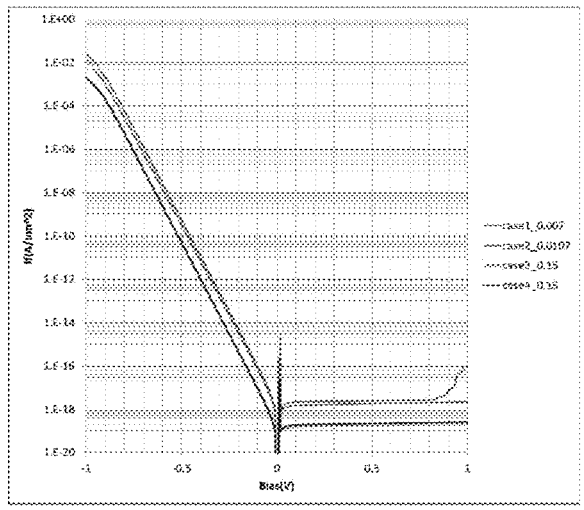
FIG. 3 presents diode volt-ampere curves for a known semiconductor device (case 1) and a plurality of semiconductor devices (cases 2-4) in accordance with embodiments herein.

FIG. 3 presents diode volt-ampere curves (for forward current) normalized for fin cross-sectional area for a known semiconductor device (case 1) and a plurality of semiconductor devices (cases 2-4) in accordance with embodiments herein. In the case 1 diode, the junction between N channel regions and P channel regions is located within the fin, i.e., P channel regions comprise the bottommost portion of each fin. The case 2 diode corresponds to the semiconductor device 100 depicted in FIG. 1. The case 3-4 diodes correspond to the semiconductor device 200 depicted in FIG. 2, differing in the depth of the N channel doped regions 230 in the semiconductor substrate 110 (case 4 having deeper N channel doped regions 230). As can be seen, the case 2 diode (junction at base of fin) has about 2.4 times the forward current of the case 1 diode (junction in the fin) at a bias voltage of −1V. The case 3 diode (junction below base of fin) has about 1.8 times the forward current of the case 1 diode (junction in the fin) at a bias voltage of −1V.

Figure 4:
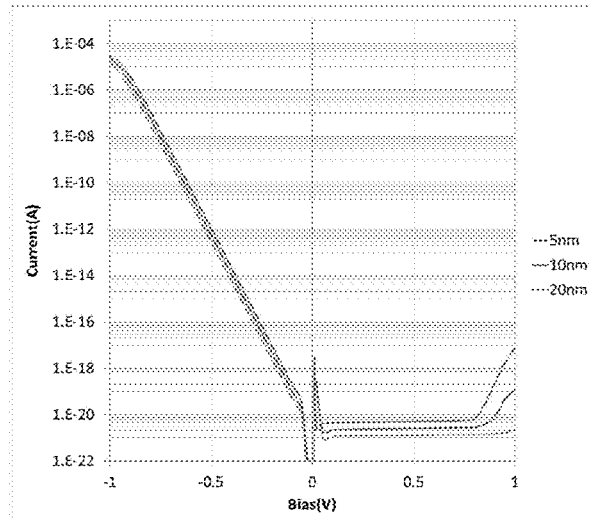
FIG. 4 presents diode volt-ampere curves for a semiconductor device of the present disclosure at various fin diameters in accordance with embodiments herein.

FIG. 4 presents diode volt-ampere curves normalized for fin cross-sectional area for a semiconductor device 100 as depicted in FIG. 1 at various fin diameters in accordance with embodiments herein. As can be seen, the diode current increases with decreasing fin width, roughly doubly when moving from 10 nm to 5 nm.

Though not to be bound by theory, the results shown in FIG. 3-4 are compatible with the forward current of an N/P diode being determined primarily by the electron concentration at the depletion edge on the P side of the junction and the rate at which the electrons diffuse into the P material and recombine. Further, electron density is expected to be a function of doping and the applied forward voltage, and diffusion is expected to be determined by the Debye length. As fin diameters decrease, electrons diffuse across the depletion region and establish a high concentration across the much wider surface at the edge of the depletion region in the substrate. This larger area is believed to explain the larger current.

Figure 5:
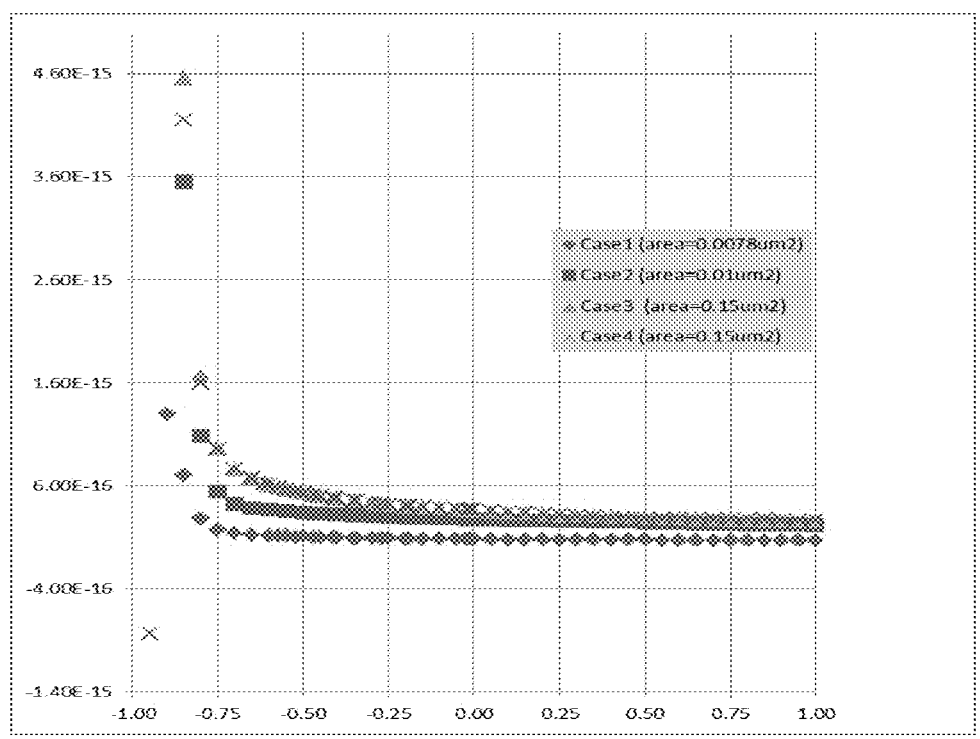
FIG. 5 presents diode capacitance curves for a known semiconductor device (case 1) and a plurality of semiconductor devices (cases 2-4) in accordance with embodiments herein.
Figure 6A:
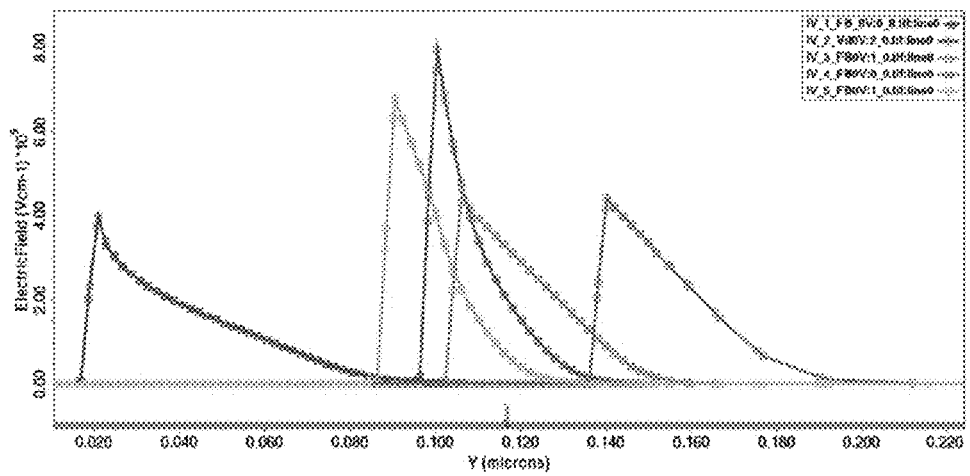
FIG. 6A presents electric field curves at Vf=0 V for a known semiconductor device (case 1) and a plurality of semiconductor devices (cases 2-4) in accordance with embodiments herein.
Figure 6B:
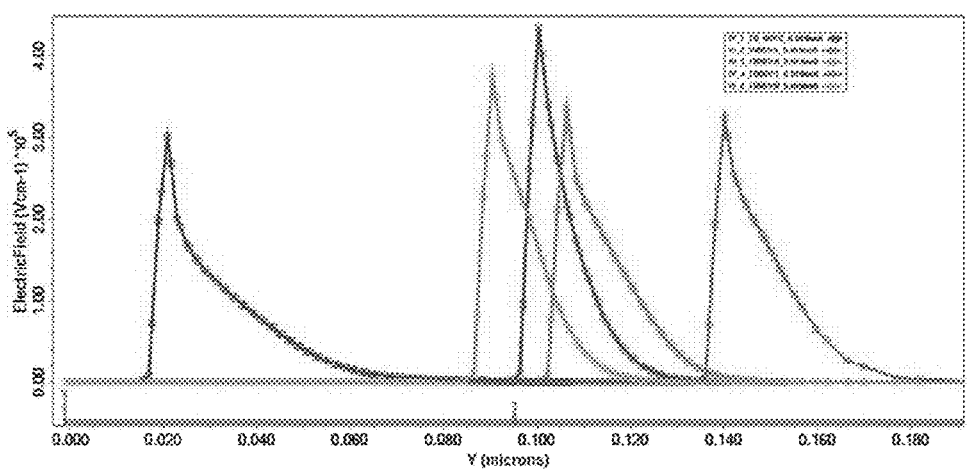
FIG. 6B presents electric field curves at Vf=−0.6 V for a known semiconductor device (case 1) and a plurality of semiconductor devices (cases 2-4) in accordance with embodiments herein.

Other electrical parameters of the known semiconductor device of case 1 and the plurality of semiconductor devices (cases 2-4) in accordance with embodiments herein are depicted in FIGS. 5-6B. Turning to FIG. 5, the capacitance of the various cases is shown. As can be seen, at bias voltages of about −0.75V and less, the semiconductor device 100 of FIG. 1 (case 2) has a higher capacitance than the known semiconductor device (case 1), and a semiconductor device 200 of FIG. 2 (cases 3-4) have an even higher capacitance.

FIG. 6A shows the electric field strength of cases 1-4, along with a case 5, at a forward voltage of 0V. The fins in all cases 1-5 had a height of 100 nm (0.100 µm), and the x-axis shows distance from the top of the fin. The case 5 diode has a junction within the fin, but at a lower height than the case 1 diode. As can be seen, the semiconductor device 100 of FIG. 1 (case 2) has about twice the peak electric field strength of the known semiconductor device with the junction in the fin (case 1). FIG. 6B shows the electric field strength of cases 1-5 at a forward voltage of −0.6V. Again, the semiconductor device 100 of FIG. 1 has a greater peak electric field strength (about 40% greater) than the known semiconductor device with the junction in the fin (case 1).

From FIGS. 6A-6B, though not to be bound by theory, the semiconductor device 100 of FIG. 1 would be expected to have greater drive current than the known semiconductor device.

Figure 7:
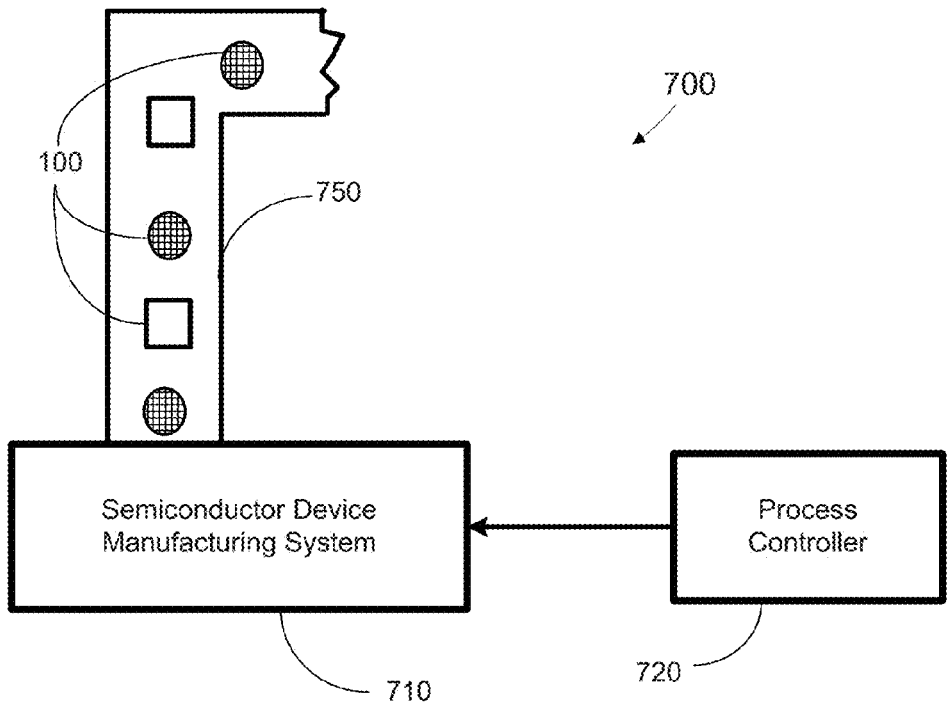
FIG. 7 illustrates a semiconductor device manufacturing system for manufacturing a device in accordance with embodiments herein.

Turning now to FIG. 7, a stylized depiction of a system for fabricating a semiconductor device 100, in accordance with embodiments herein, is illustrated. The system 700 of FIG. 7 may comprise a semiconductor device manufacturing system 710 and a process controller 720. The semiconductor device manufacturing system 710 may manufacture semiconductor devices 100 based upon one or more instruction sets provided by the process controller 720. In one embodiment, the instruction set may comprise instructions to form a plurality of fins on a semiconductor substrate; dope a plurality of first regions with an N channel dopant, thereby forming a plurality of N channel doped regions, wherein at least a part of each N channel doped region is located within one of the plurality of fins; and dope a plurality of second regions within the semiconductor substrate under the plurality of fins and adjacent to the N channel doped regions with a P channel dopant, thereby forming a plurality of P channel doped regions.

In one further embodiment, the instruction set may comprise instructions to dope each first region with an N channel dopant at an N channel dopant concentration and dope the each second region with a P channel dopant at a P channel dopant concentration, wherein the N channel dopant concentration is greater than the P channel dopant concentration.

The semiconductor device manufacturing system 710 may comprise various processing stations, such as etch process stations, photolithography process stations, CMP process stations, etc. One or more of the processing steps performed by the semiconductor device manufacturing system 710 may be controlled by the process controller 720. The process controller 720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device manufacturing system 710 may produce semiconductor devices 100 (e.g., integrated circuits) on a medium, such as silicon wafers. The semiconductor device manufacturing system 710 may provide processed semiconductor devices 100 on a transport mechanism 750, such as a conveyor system. In some embodiments, the conveyor system may be sophisticated clean room transport systems that are capable of transporting semiconductor wafers. In one embodiment, the semiconductor device manufacturing system 710 may comprise a plurality of processing steps, e.g., the $1^{st}$ process step, the $2^{nd}$ process step, etc.

In some embodiments, the items labeled "100" may represent individual wafers, and in other embodiments, the items 100 may represent a group of semiconductor wafers, e.g., a "lot" of semiconductor wafers. The semiconductor device 100 may comprise a diode. In one embodiment, the semiconductor device 100 may further comprises one or more of a transistor, a capacitor, a resistor, a memory cell, a processor, and/or the like.

The system 700 may be capable of manufacturing various products involving various technologies. Generally, the system 700 may be capable of manufacturing products comprising one or more diodes, such as low noise diodes, high current diodes, low capacitance diodes, and fast switching diodes, among others. Alternatively or in addition, the system 700 may produce devices of CMOS technology, Flash technology, BiCMOS technology, power devices, memory devices (e.g., DRAM devices), NAND memory devices, and/or various other semiconductor technologies.

Figure 8:
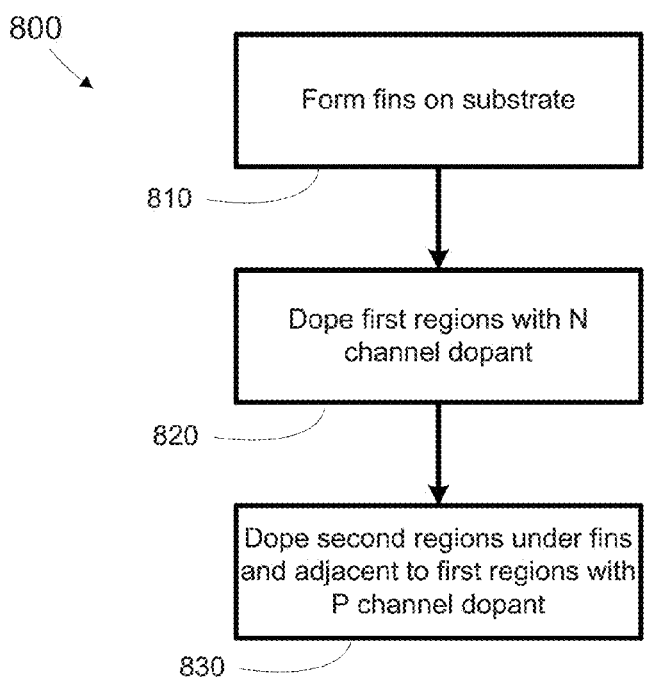
FIG. 8 illustrates a flowchart of a method in accordance with embodiments herein.

Turning to FIG. 8, a flowchart of a method 800 in accordance with embodiments herein is depicted. The method 800 may comprise forming (at 810) a plurality of fins 120 on a semiconductor substrate 110. The fins 120 may be formed from the same material as the semiconductor substrate 110. In this embodiment, the fins 120 may be formed by, e.g., etching away inter-fin spaces from a semiconductor material. Alternatively, the fins 120 may be formed by depositing or growing semiconductor material on the semiconductor substrate 110. In this embodiment, the fins 120 may comprise the same semiconductor material as the semiconductor substrate 110 or a different semiconductor material.

The method 800 may also comprise doping (at 820) a plurality of first regions with an N channel dopant, thereby forming a plurality of N channel doped regions 130 or 230, wherein at least a part of each N channel doped region is located within one of the plurality of fins 120. The method 800 may further comprise doping (at 830) a plurality of second regions within the semiconductor substrate under the plurality of fins and adjacent to the N channel doped regions with a P channel dopant, thereby forming a plurality of P channel doped regions 115. Appropriate dopants and doping techniques are known in the art.

The methods described above may be governed by instructions that are stored in a non-transitory computer readable storage medium and that are executed by, e.g., a processor in a computing device. Each of the operations described herein (e.g., FIG. 8) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a semiconductor substrate; and
a plurality of fins formed on the semiconductor substrate; wherein each of the plurality of fins comprises an N channel doped region comprising an N channel dopant, and the semiconductor substrate further comprises a plurality of P channel doped regions comprising a P channel dopant, wherein each of the P channel doped regions is disposed under one of the plurality of fins and is adjacent to the N channel doped region of the fin, wherein a junction is present between each N channel doped region and the P channel doped region.

2. The semiconductor device of claim 1, wherein a junction between each N channel doped region and the P channel doped region disposed under the fin comprising the N channel doped region is located at the base of the fin.

3. The semiconductor device of claim 2, wherein the junction has a width from about 5 nm to about 14 nm.

4. The semiconductor device of claim 1, wherein a junction between each N channel doped region and the P channel doped region disposed under the fin comprising the N channel doped region is located in the substrate below the base of the fin.

5. The semiconductor device of claim 4, wherein the junction has a width from about 22 nm to about 200 nm.

6. The semiconductor device of claim 1, wherein each N channel doped region comprises the N channel dopant at an N channel dopant concentration greater than a P channel dopant concentration in each P channel doped region.

7. The semiconductor device of claim 6, wherein the N channel dopant concentration is from about $10^{17}$ atoms/cm$^3$ to about $10^{21}$ atoms/cm$^3$ and the P channel dopant concentration is from about $10^{15}$ atoms/cm$^3$ to about $10^{19}$ atoms/cm$^3$.

8. The semiconductor device of claim 1, wherein each fin of the plurality of fins has a sidewall angle from about 85° to about 90°.

9. The semiconductor device of claim 1, wherein the plurality of fins have a pitch from about 22 nm to about 48 nm.

10. A method, comprising:
forming a plurality of fins on a semiconductor substrate;
doping a plurality of first regions with an N channel dopant, thereby forming a plurality of N channel doped regions, wherein at least a part of each N channel doped region is located within one of the plurality of fins; and
doping a plurality of second regions within the semiconductor substrate under the plurality of fins and adjacent to the N channel doped regions with a P channel dopant, thereby form a plurality of P channel doped regions, wherein a junction is present between each N channel doped region and the P channel doped region.

11. The method of claim 10, wherein a junction between each N channel doped region and the P channel doped region adjacent thereto is located at the base of the fin in which the at least a part of the N channel doped region is located.

12. The method of claim 11, wherein the junction has a width from about 5 nm to about 14 nm.

13. The method of claim 10, wherein a junction between each N channel doped region and the P channel doped region adjacent thereto is located below the base of the fin in which the at least a part of the N channel doped region is located.

14. The method of claim 13, wherein the junction has a width from about 22 nm to about 200 nm.

15. The method of claim 10, wherein doping the plurality of first regions comprises doping each first region with an N channel dopant at an N channel dopant concentration; doping the plurality of second regions comprises doping each second region with doping with a P channel dopant at a P channel dopant concentration; and the N channel dopant concentration is greater than the P channel dopant concentration, thereby increasing the junction electric field.

16. The method of claim 10, wherein the N channel dopant concentration is from about $10^{17}$ atoms/cm$^3$ to about $10^{21}$ atoms/cm$^3$ and the P channel dopant concentration is from about $10^{15}$ atoms/cm$^3$ to about $10^{19}$ atoms/cm$^3$.

17. The method of claim 10, wherein each fin of the plurality of fins has a sidewall angle from about 85° to about 90°.

18. The method of claim 10, wherein the plurality of fins have a pitch from about 22 nm to about 48 nm.

19. A system, comprising:
a process controller, configured to provide an instruction set for manufacture of the semiconductor device to a manufacturing system;
the manufacturing system, configured to manufacture the semiconductor device according to the instruction set, wherein the instruction set comprises instructions to:
form a plurality of fins on a semiconductor substrate;
dope a plurality of first regions with an N channel dopant, thereby forming a plurality of N channel doped regions, wherein at least a part of each N channel doped region is located within one of the plurality of fins; and dope a plurality of second regions within the semiconductor substrate under the plurality of fins and adjacent to the N channel doped regions with a P channel dopant, thereby forming a plurality of P channel doped regions, wherein a junction is present between each N channel doped region and the P channel doped region.

20. The system of claim 19, wherein the instruction set comprises instructions to dope each first region with an N channel dopant at an N channel dopant concentration and dope the plurality of second regions comprises doping each second region with doping with a P channel dopant at a P channel dopant concentration; wherein the N channel dopant concentration is greater than the P channel dopant concentration.

* * * * *